(12) United States Patent
Oshinowo

(10) Patent No.: US 6,257,255 B1
(45) Date of Patent: Jul. 10, 2001

(54) SUBSTRATE TREATMENT DEVICE

(75) Inventor: John Oshinowo, Bad Dürrheim (DE)

(73) Assignee: STEAG MicroTech GmbH (DE)

( * ) Notice: Subject to any disclaimer, the term of this patent is extended or adjusted under 35 U.S.C. 154(b) by 0 days.

(21) Appl. No.: 09/297,218

(22) PCT Filed: Oct. 1, 1997

(86) PCT No.: PCT/EP97/05406

§ 371 Date: Apr. 23, 1999

§ 102(e) Date: Apr. 23, 1999

(87) PCT Pub. No.: WO98/18154

PCT Pub. Date: Apr. 30, 1998

(30) Foreign Application Priority Data

Oct. 24, 1996 (DE) ............................................. 196 44 255

(51) Int. Cl.[7] ........................................................... B08B 3/10
(52) U.S. Cl. ........................... 134/141; 134/164; 134/902; 211/41.18; 396/644
(58) Field of Search ................................... 134/137, 902, 134/61, 83, 140, 141, 164, 156; 211/41.13, 41.14, 41.17, 41.18; 346/626, 629, 628, 642, 644; 396/654, 603

(56) References Cited

U.S. PATENT DOCUMENTS

| | | | |
|---|---|---|---|
| 448,383 | * | 3/1891 | Taylor . |
| 563,914 | * | 7/1896 | Durand . |
| 800,439 | * | 9/1905 | Gennert . |
| 1,141,314 | * | 6/1915 | Caldwell . |
| 1,234,641 | * | 7/1917 | Dickson . |
| 1,902,338 | * | 3/1933 | Riley . |
| 2,663,304 | * | 12/1953 | Logan . |
| 2,682,213 | * | 6/1954 | Shapiro . |
| 3,077,155 | * | 2/1963 | Maddock et al. . |
| 3,349,689 | * | 10/1967 | Buechner . |
| 3,461,008 | * | 8/1969 | Laurie, Jr. . |
| 3,559,553 | * | 2/1971 | Buechner . |
| 3,592,690 | * | 7/1971 | Schoffmann . |
| 3,739,706 | * | 6/1973 | Carsten . |
| 3,794,053 | * | 2/1974 | Jones ..................................... 134/156 |
| 4,547,065 | * | 10/1985 | Thebault . |
| 4,817,650 | * | 4/1989 | Tilton ................................... 134/156 |
| 5,143,103 | | 9/1992 | Basso et al. . |
| 5,569,330 | * | 10/1996 | Schild et al. .............................. 134/1 |
| 5,913,981 | * | 6/1999 | Florez ...................................... 134/3 |
| 5,934,299 | * | 8/1999 | Akatsu et al. ........................ 134/105 |

FOREIGN PATENT DOCUMENTS

| | | |
|---|---|---|
| 32 05 816 | 8/1983 | (DE) . |
| 33 00 666 | 8/1983 | (DE) . |
| 34 29 232 | 3/1985 | (DE) . |
| 34 13 386 | 10/1985 | (DE) . |
| 42 23 327 | 3/1993 | (DE) . |
| 195 46 990 | 7/1996 | (DE) . |
| 44 13 077 | 2/1997 | (DE) . |
| 195 37 879 | 4/1997 | (DE) . |
| 196 16 402 | 11/1997 | (DE) . |
| 196 37 875 | 11/1997 | (DE) . |
| 197 22 423 | 12/1997 | (DE) . |
| 196 52 526 | 1/1998 | (DE) . |
| 96 14944 | 5/1996 | (WO) . |

* cited by examiner

Primary Examiner—Frankie L. Stinson
(74) Attorney, Agent, or Firm—Robert Becker & Assoc

(57) ABSTRACT

A device for the treatment of substrates has a container having walls and being filled with a treatment fluid. At least one substrate carrier is mounted in the container so as to move the substrates vertically in a reciprocating manner without a substrate support. Substrate side walls are provided between the substrates and the container walls. These substrate side walls extend parallel to the substrates and are vertically movable in a reciprocating manner with the substrates.

11 Claims, 1 Drawing Sheet

SUBSTRATE TREATMENT DEVICE

BACKGROUND OF THE INVENTION

The invention concerns a device for the treatment of substrates comprising a container filled with a treatment fluid, having at least one substrate carrier that moves the substrates vertically in a reciprocating manner without a substrate support.

Devices of the aforementioned kind have been known, for instance, from DE 44 13 077 A1 and DE 195 46 990 A1 of the applicant of this present patent application and are described in the German patent applications DE 195 37 879.2, DE 196 16 402.8, DE 196 52 526.8 or DE 196 37 875.3 of the same applicant as well, which have not been published as of the filing date of this application. Devices of the aforementioned kind are being used especially advantageously for the treatment of wafers. To dry the substrates, the substrate carrier is lifted, so that the substrates on the substrate carrier are lifted out of the treatment fluid, for example, a rinsing agent, and may be dried utilizing the Marangoni method. In these devices the substrates are moved in the fluid container independent of substrate support, for example, independent of substrate and wafer cassettes, which are known, e.g., from DE 42 23 327 A1 or DE 34 29 232 A1. When rinsing or drying such substrates, these substrate supports have the disadvantage, among others, that an optimal uniform fluid flow in the fluid container is not possible because the cassette presents a flow obstacle and because the substrates in such a cassette cannot be treated with ultrasound, as suggested, for example, in the as yet unpublished documents DE 197 22 473 A1 or DE 196 16 402. The substrate support or cassette also presents a disadvantage during drying of the substrates for example, wafers, because due to their large surfaces area, edges, corners, and slots they can be dried only with difficulty and with a great time expenditure.

In the conventional devices in which the substrates are reciprocated vertically by a substrate carrier independent of a substrate support or cassette, at least at the outer surfaces of the corresponding substrates and the parallel extending container walls, a relative motion occurs, subjecting the outer surface of the substrates due to this relative motion to electrical charging effects that adversely affect this process, especially, if the substrates are highly sensitive wafers for chip manufacturing. Due to the relative motion between the externally positioned substrates of a substrate package and/or the different materials of the substrates, on the one hand, and the container walls, on the other hand, flow conditions at the side areas of the substrate package differ from the flow conditions between the substrates within the substrate package. Therefore, externally positioned substrates, or at least the side areas of externally positioned substrates facing the container wall, are treated, rinsed or dried less efficiently, so that disadvantages are observed and the productivity of the entire device is unsatisfactory.

Based on this, the object of the invention is the development of a device that can achieve a homogeneous treatment process, for instance, rinsing and drying, for all substrates regardless of their arrangement within the container.

SUMMARY OF THE INVENTION

The object of the invention is inventively solved by providing substrate side walls between the substrates and the container walls that extend parallel to the substrates and are vertically movable in a reciprocating manner with the substrates. By the inventive use of substrate side walls that separate each substrate package, the flow conditions at the outer surfaces of the outermost positioned substrates are no different from the conditions between substrates within the substrate package, thus providing the same efficient treatment, rinsing and drying results. These externally positioned substrates must therefore not be rejected as flawed products. Furthermore, no electrical charges are caused by the substrate side walls at the externally positioned substrates because there is no relative motion between the outwardly positioned substrates and the container wall.

Advantageously, the substrate side walls are mechanically connected with the substrate carrier and are vertically movable in a reciprocating manner with it. The arrangement is thus constructively simple.

It is especially advantageous to position a substrate carrier arm outside the substrate area formed by the substrate side walls, wherein the substrate carrier arm is positioned advantageously in an arm slot within one of the container walls. In this manner, the inner volume of the container can be minimized, which is especially advantageous in regard to time savings for filling and draining and, in particular, in regard to the required treatment fluid volume. The savings of treatment fluid, for example, rinsing fluid, are important in particular, in regard to the costly materials required, recycling procedures, and possible environmental harm.

According to another very advantageous embodiment of this invention, inlet jets and/or openings for the introduction of the treatment fluid are provided within the arm slot. In this manner, proper circulation of the treatment fluid within the arm slot and a rinsing of the arm slot is ensured, thus preventing the higher contamination levels of the treatment fluid within the arm slot as well as between the substrate carrier arm and the arm slot.

The inventive device is advantageously used for the drying process utilizing the Marangoni method. As described in detail in the documents and applications of the applicant mentioned above, a gas, advantageously isopropyl alcohol, nitrogen or a gas mixture of these components, is directed, for example, utilizing a hood positioned above the container, onto the fluid surface to improve and shorten the drying process utilizing the Marangoni effect. According to an advantageous embodiment of this invention, a tube within the arm slot and/or substrate carrier arm is provided for the controlled discharge of the gas above the treatment fluid when the gas within the hood is displaced by the lifting of the substrates and substrate side walls.

BRIEF DESCRIPTION OF THE DRAWINGS

The invention is described in the following with the aid of a preferred embodiment. It is shown in.

DESCRIPTION OF PREFERRED EMBODIMENT

Figure 1:
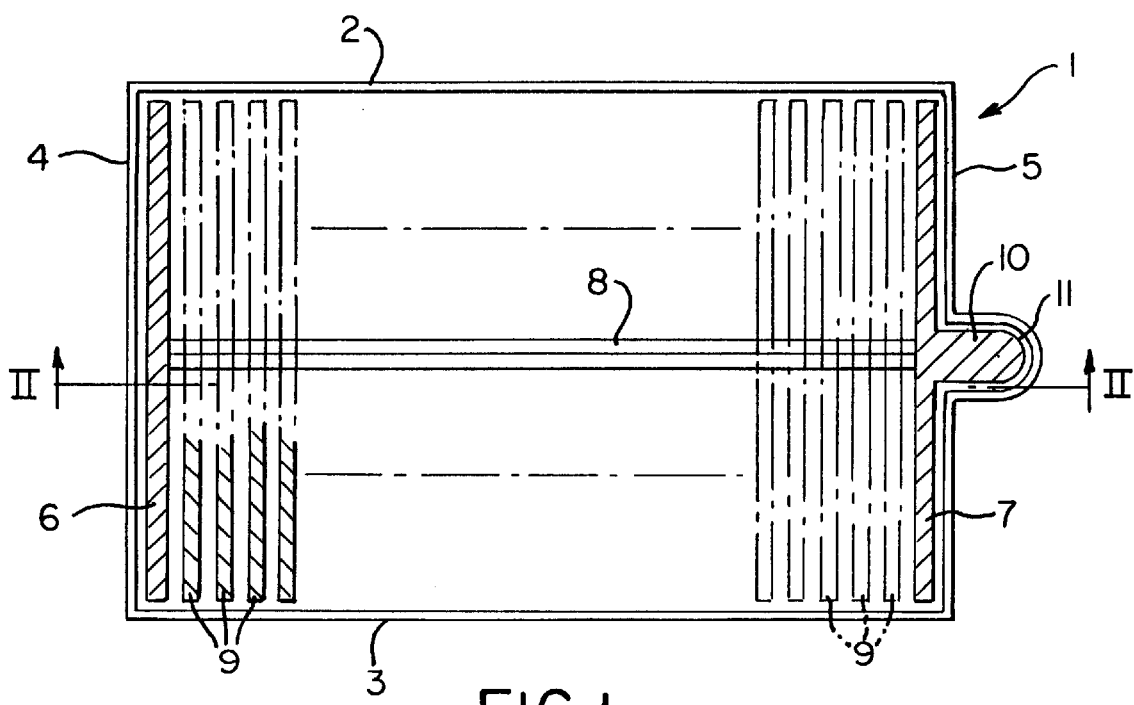
FIG. 1: a schematic top view of the inventive device.
Figure 2:
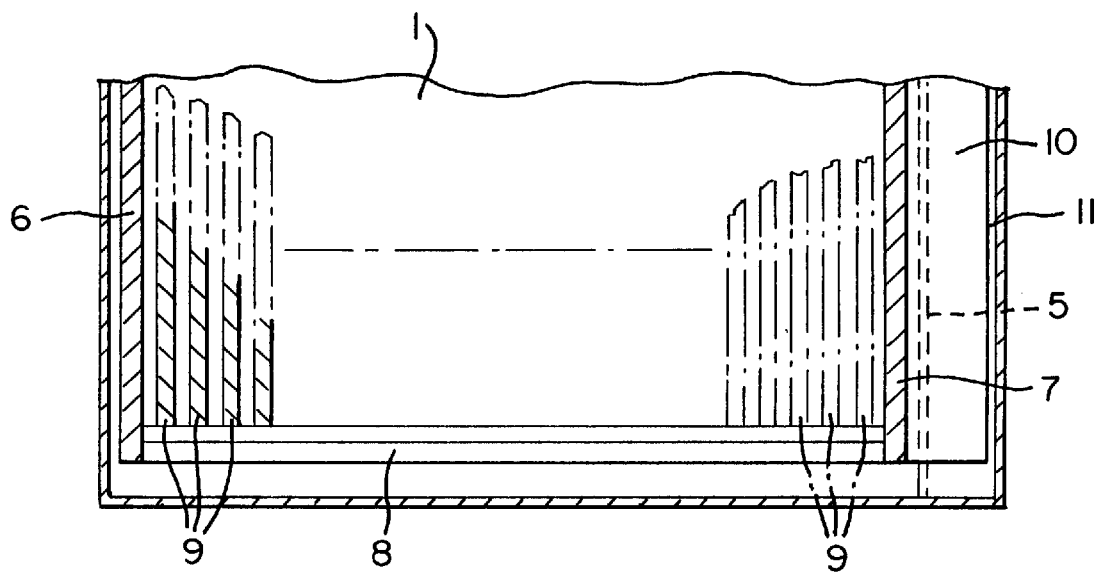
FIG. 2: the device of FIG. 1 in cross section along the section line II—II.

A fluid container 1 is comprised of longitudinal walls 2, 3 and transverse walls 4, 5. Extending parallel to the perpendicular walls 4, 5 and adjacent to them, substrate side walls 6, 7 are provided in the fluid container 1 that are connected to a substrate carrier 8 and vertically movable in a reciprocating manner with this carrier in the fluid container 1. The substrates 9 are positioned between the substrate side walls 6, 7, extending parallel to them and being supported by the substrate carrier 8. In the shown embodiment, the substrate carrier 8 is knife-shaped and the substrates are guided in non-represented guiding slots in or at the longitudinal walls 2, 3 of the fluid container 1.

The substrate carrier 8 is attached to a substrate carrier arm 10 positioned within an arm slot 11. The substrate carrier arm slot 11 is supplied with treatment fluid from the bottom in the same manner as the inside of the fluid container 1. The fluid rises to the top and is discharged across the overflow edge or an opening, as described in the above mentioned publications and applications of the applicant.

During the lifting of the substrates from the fluid container 1, the substrate side walls 6, 7 that serve as separation plates for the substrates 9 in regard to the transverse walls 4, 5 of the fluid container 1, are lifted with the substrates, thus providing homogeneous, steady flow conditions within the substrate package as well as along the externally positioned substrates 9 of the package and at the outwardly oriented surfaces of these substrates. In this manner, in contrast to conventional devices, it is possible to treat, rinse and/or dry externally positioned substrates 9 in the same manner as other substrates 9, so that these substrates 9 must not be rejected. This also prevents a high amount of rejects caused by charging effects at least of the externally positioned substrates 9 resulting from the relative motion of these substrates 9 in respect to the horizontal walls 4, 5 of the fluid container 1. The substrate side walls 6, 7 are advantageously comprised of a wall surface at least the size of the substrate surface, thus shielding and separating the entire substrate area from the horizontal walls 4, 5 of the fluid container 1.

The embodiment of the arm slot 11 in one of the two horizontal walls 4, 5 of the fluid container 1 allows to minimize the container volume, optimizing not only the flow conditions, but also saving costly treatment fluid that is expensive to recycle and possibly environmentally harmful.

The gas directed onto the surface of the treatment fluid can be discharged in a controlled manner through the arm slot 11 and/or substrate carrier arm 10, when the gas is displaced by the lifting substrates and substrate side walls within a hood positioned above. The invention has been disclosed with the aid of a preferred embodiment. However, persons skilled in the art may be able to implement various alterations, designs and modifications without departing from the gist of the invention. For example, it is possible to use substrate carriers 8 that support the substrate without using guiding slots in the fluid container 1. It is also possible to provide an arm slot 11 in both horizontal walls 4, 5 if this should become a necessary requirement due to the number or the weight of the substrates. Furthermore, the jets, openings, diffusers and other inlet devices for introducing the treatment fluid, for example, a rinsing agent, from the bottom of the fluid container 1 and/or from the arm slot 11 may be selected according to the respective requirements. To avoid repetition concerning this embodiment, the German applications DE.196 44 253.2, DE 196 44 254.0 and DE 196 44 255.9 of the same application date are incorporated by reference into the present patent application.

The specification incorporates by reference the entire disclosure of International Application PCT/EP97/05406 of Oct. 1, 1997.

The present invention is, of course, in no way restricted to the specific disclosure of the specification and drawings, but also encompasses any modifications within the scope of the appended claims.

What is claimed is:

1. A device for the treatment of substrates comprising:
   a container having walls and being filled with a treatment fluid;
   at least one substrate carrier mounted in said container so as to vertically move substrates in a reciprocating manner without a substrate cassette;
   substrate side walls provided between said substrates and said walls of said container, wherein said substrate side walls extend parallel to said substrate and vertically reciprocate with said substrates.

2. A device for the treatment of substrates according to claim 1, wherein said substrate side walls are connected to said at least one substrate carrier and vertically reciprocate with said at least one substrate carrier.

3. A device for the treatment of substrates according to claim 1, further comprising a substrate carrier arm positioned outside a substrate area formed by said substrate side walls, wherein said at least one substrate carrier is connected to said substrate carrier arm.

4. A device for the treatment of substrates according to claim 3, wherein one of said walls of said container has an arm slot and wherein said substrate carrier arm is mounted in said arm slot.

5. A device for the treatment of substrates according to claim 4, wherein said arm slot has a bottom side provided with one or more inlets selected from the group consisting of jets, openings, and diffusors.

6. A device for the treatment of substrates according to claim 4, comprising a tube arranged in said arm slot for discharging a gas present above the treatment fluid.

7. A device for the treatment of substrates according to claim 6, wherein said gas is isopropyl alcohol, nitrogen or a mixture of isopropyl alcohol and nitrogen.

8. A device for the treatment of substrates according to claim 1, wherein said device is used in a drying device utilizing the Marangoni method.

9. A device for the treatment of substrates comprising:
   a container having walls and being filled with a treatment fluid;
   at least one substrate carrier mounted in said container so as to vertically move substrates in a reciprocating manner without a substrate cassette;
   substrate side walls provided between said substrates and said walls of said container, wherein said substrate side walls extend parallel to said substrate and vertically reciprocate with said substrates;
   a substrate carrier arm positioned outside a substrate area formed by said substrate side walls, wherein said at least one substrate carrier is connected to said substrate carrier arm, wherein one of said walls of said container has an arm slot and wherein said substrate carrier arm is mounted in said arm slot, said arm slot having a bottom side provided with one or more inlets selected from the group consisting of jets, openings, and diffusors.

10. A device for the treatment of substrates comprising:
    a container having walls and being filled with a treatment fluid;
    at least one substrate carrier mounted in said container so as to vertically move substrates in a reciprocating manner without a substrate cassette;
    substrate side walls provided between said substrates and said walls of said container, wherein said substrate side walls extend parallel to said substrate and vertically reciprocate with said substrates;
    a substrate carrier arm positioned outside a substrate area formed by said substrate side walls, wherein said at least one substrate carrier is connected to said substrate carrier arm, wherein one of said walls of said container has an arm slot and wherein said substrate carrier arm is mounted in said arm slot; and
    a tube arranged in said arm slot for discharging a gas present above the treatment fluid.

11. A device for the treatment of substrates according to claim 10, wherein said gas is isopropyl alcohol, nitrogen or a mixture of isopropyl alcohol and nitrogen.

* * * * *

UNITED STATES PATENT AND TRADEMARK OFFICE
CERTIFICATE OF CORRECTION

PATENT NO.    : 6,257,255 B1
DATED         : July 10, 2001
INVENTOR(S)   : John Oshinowo It is certified that error appears in the above-identified patent and that said Letters Patent is hereby corrected as shown below:

<u>Title page, Item [54], and Column 1,</u>
-- [54] Title: DEVICE FOR TREATING SUBSTRATES --

Signed and Sealed this

Eleventh Day of June, 2002

Attest:

JAMES E. ROGAN
Attesting Officer  *Director of the United States Patent and Trademark Office*